United States Patent
Vaillancourt et al.

(10) Patent No.: US 7,132,832 B2
(45) Date of Patent: *Nov. 7, 2006

(54) SELF-DIAGNOSIS SYSTEM FOR AN ENERGY STORAGE DEVICE

(75) Inventors: Jean-Pierre Vaillancourt, Boucherville (CA); Frederic Lague, Sainte-Julie (CA); Monique Richard, Longueuil (CA); Sebastien Geoffroy, Montreal (CA); Michel Parent, St-Jean-sur-Richelieu (CA); Yves Choquette, St-Julie (CA); Estelle Potvin, Saint-Bruno de Montarville (CA)

(73) Assignee: Avestor Limited Partnership, Boucherville (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/200,098

(22) Filed: Aug. 10, 2005

(65) Prior Publication Data

US 2006/0028172 A1    Feb. 9, 2006

Related U.S. Application Data

(63) Continuation of application No. 10/478,745, filed as application No. PCT/CA2002/000767 on May 24, 2002, now Pat. No. 6,956,355.

(30) Foreign Application Priority Data

May 25, 2001    (CA)    .................... 2348586

(51) Int. Cl.
    *G01N 27/416*    (2006.01)
(52) U.S. Cl. ...................................................... 324/426
(58) Field of Classification Search ............... 320/132; 324/426–432
    See application file for complete search history.

(56) References Cited

U.S. PATENT DOCUMENTS

| | | | | |
|---|---|---|---|---|
| 3,816,805 A | * | 6/1974 | Terry | 320/123 |
| 3,886,426 A | * | 5/1975 | Daggett | 320/117 |
| 5,332,927 A | * | 7/1994 | Paul et al. | 307/66 |
| 6,956,355 B1 | * | 10/2005 | Vaillancourt et al. | 320/132 |

\* cited by examiner

*Primary Examiner*—Pia Tibbits
(74) *Attorney, Agent, or Firm*—Osler, Hoskin & Harcourt LLP

(57) ABSTRACT

A self-diagnosis system for an energy storage device, the latter including a plurality of electrochemical cells connected in series or parallel to form a cell string. The self-diagnosis system correlates a state of health of the battery based on the internal resistance value of each electrochemical cell of the energy storage device and determines a corresponding battery initial capacity which enables the self-diagnosis system to evaluate the exact capacity of the battery at any given time.

20 Claims, 8 Drawing Sheets

SELF-DIAGNOSIS SYSTEM FOR AN ENERGY STORAGE DEVICE

This application is a continuation of U.S. patent application Ser. No. 10/478,745 filed on May 24, 2002 (as a National Phase Entry of International Application No. PCT/CA2002/000767) by Vaillancourt et al., now issued to U.S. Pat. 6,956,355, and hereby incorporated by reference herein.

FIELD OF THE INVENTION

The present invention generally relates to the field of energy storage devices, such as rechargeable batteries. More specifically, the invention relates to a self-diagnosis system for a rechargeable battery capable to estimate the short term and long term capacity of the battery as well as its life expectancy.

BACKGROUND OF THE INVENTION

Rechargeable batteries are used in a wide variety of applications, for example as a propulsion power source for electric and hybrid vehicles or as a power reserve in telecommunications network stations. In any application, it is important to monitor the discharge capacity of the battery at any given time, as well as to monitor the state of health of the battery as it ages through degradation of its chemistry over repeated floating/charging/discharging cycles. This information helps to manage the timely replacement of a battery approaching the end of its useful life.

A battery can be approximated as a voltage source with an internal resistance. The internal resistance of a battery varies with battery age, but remains relatively constant over a short time period. As the battery ages during floating, charging and discharging, its internal resistance increases. The increase of the internal resistance is caused by the degradation of the battery's chemistry, which in turn reduces the battery's ability to hold a charge. The performance of a battery is characterized by its discharge curve, which is a curve of the battery voltage as a function of time at a predetermined discharge rate or as a function of the percentage of the remaining charge of the battery. As the internal resistance of the battery increases, the discharge curve drops, indicating a reduction of the battery capacity. The battery discharge curve may vary with the internal resistance of the battery, its discharge rate and its temperature.

Various systems, methods and apparatus have been devised to estimate the battery capacity and the battery remaining life based on the internal resistance of the battery. U.S. Pat. No. 5,404,106 discloses an electronic control unit, switching means for connecting and disconnecting the positive and negative terminals of the battery from an electrical load, first and second voltage measurement means for measuring battery voltage in the connected and disconnected states, discharge current measurement means and battery electrolyte temperature sensing means. The voltage and current measurements are relayed to the control unit, which calculates the internal resistance of the battery. The remaining capacity level of the battery is then estimated from stored values corresponding to the calculated internal resistance, and a correction coefficient associated with the electrolyte temperature reading is applied to the remaining capacity level of the battery to more accurately estimate the remaining battery capacity.

U.S. Pat. No. 6,087,808 discloses a system and circuit means that measure the internal resistance of the battery and an output current at varying battery loads. These measurements are relayed to a computer having stored in its memory an array of discharge curves specific to the battery type. Software running on the computer employs the internal resistance and output current readings to select from its memory a discharge curve most closely associated with the state of the battery as characterized by the internal resistance and output current values. The selected discharge curve is then used to estimate the relative remaining life of the battery.

U.S. Pat. No. 6,167,309 discloses a system or process for estimating the level of power depletion in a cardiac pacing system having a lithium battery, by measuring and correlating the rate of charge of a charge storage capacitor connected to the lithium battery to a value of the internal resistance of the battery, which provides an estimation of the remaining battery capacity and the replacement time for the battery.

Each of the systems or methods described above provide an estimation of the remaining battery capacity based on a correlation of voltage measurements taken at the battery terminals to a discharge curve. Unfortunately, these voltage measurements prove inaccurate when a battery discharge curve comprises a mild slope and are inadequate when a battery discharge curve comprises a plateau wherein the voltage of the battery is not sufficient to establish the remaining battery capacity. The systems or methods described above also measure an output current to determine the internal resistance of the battery. However, the measurement of an output current to determine the internal resistance renders the value of the internal resistance somewhat approximate. Also, the internal resistance is calculated based on measurements taken at the battery terminals, and provides little information on the state of the individual cells of the battery.

Furthermore, none of the systems or methods described above provide an accurate evaluation of the state of health of a battery, in order to predict how long the battery may be able to perform before reaching a level of performance (battery capacity) at which replacement is required.

Against this background, it clearly appears that a need exists in the industry for an improved system for accurately predicting the remaining capacity of an energy storage device, as well as for accurately evaluating the state of health of the energy storage device.

SUMMARY OF THE INVENTION

According to a broad aspect, the invention provides a self-diagnosis system for an energy storage device, the energy storage device including a plurality of electrochemical cells forming a cell string. The self-diagnosis system includes a current source providing a constant current, a cell selector switch operative to select a particular one of the electrochemical cells within the cell string, and voltage measurement means for measuring an initial voltage and a second voltage of the particular cell. The self-diagnosis system also includes a processing unit coupled to the voltage measurement means, the processing unit being operative to calculate an internal resistance of the selected cell on a basis of the constant current value and the initial and second voltages. The electronic self-diagnosis system is capable to determine a state of health of the energy storage device, on the basis of the internal resistance of each cell of the cell string.

According to another broad aspect, the invention provides an energy storage device comprising a housing, a plurality of electrochemical cells each having a positive, a negative electrode and an electrolyte separator therebetween. The plurality of electrochemical cells are connected in series or parallel to form a cell string within the housing. The energy storage device also includes an electronic self-diagnosis system, which correlates a measured internal resistance of the cell string to a state of health value representative of a capacity fade of the cell string. The electronic self-diagnosis system selects an initial capacity of the energy storage device corresponding to the state of health value, and monitors a state of charge of the energy storage device by measuring energy flowing in or out of the energy storage device and adding or subtracting the energy to determine an exact battery capacity from the selected initial capacity.

In a preferred embodiment of the invention, the energy flowing out is calculated as a current drawn from the energy storage device over time during a discharge and the energy flowing in is calculated as a current received by the energy storage device over time during a charge. The measured energy is representative of the battery capacity flow.

According to a further broad aspect, the invention also provides an energy storage device comprising a housing, a plurality of electrochemical cells each having a positive, a negative electrode and an electrolyte separator therebetween. The plurality of electrochemical cells are connected in series or parallel to form a cell string within the housing. The energy storage device also includes an electronic self-diagnosis system comprising a processing unit, a current source, a voltage measurement means and a cell selector switch adapted to select a single electrochemical cell within the cell string. The electronic self-diagnosis system measures an internal resistance of each cell of the cell string, one cell at a time, to determine a state of health of the energy storage device, wherein the cell selector switch selects a first cell of the cell string, the voltage measurement means measures an initial voltage and a second voltage of the selected cell and the current source provides a constant current. The constant current value, the initial and second voltage measurement are processed by the processing unit wherein the processing unit calculates the internal resistance of the selected cell using Ohm's law, the processing unit further comprising a memory for storing electrochemical cell's capacity fade as a function of its internal resistance. The processing unit correlates the highest calculated internal resistance of the cell string to a corresponding state of health value stored in the memory to define an overall state of health of the energy storage device.

According to yet another broad aspect, the invention provides a method for determining the state of health of an energy storage device.

BRIEF DESCRIPTION OF THE DRAWINGS

A detailed description of examples of implementation of the present invention is provided hereinbelow with reference to the following drawings, in which.

Figure 1:
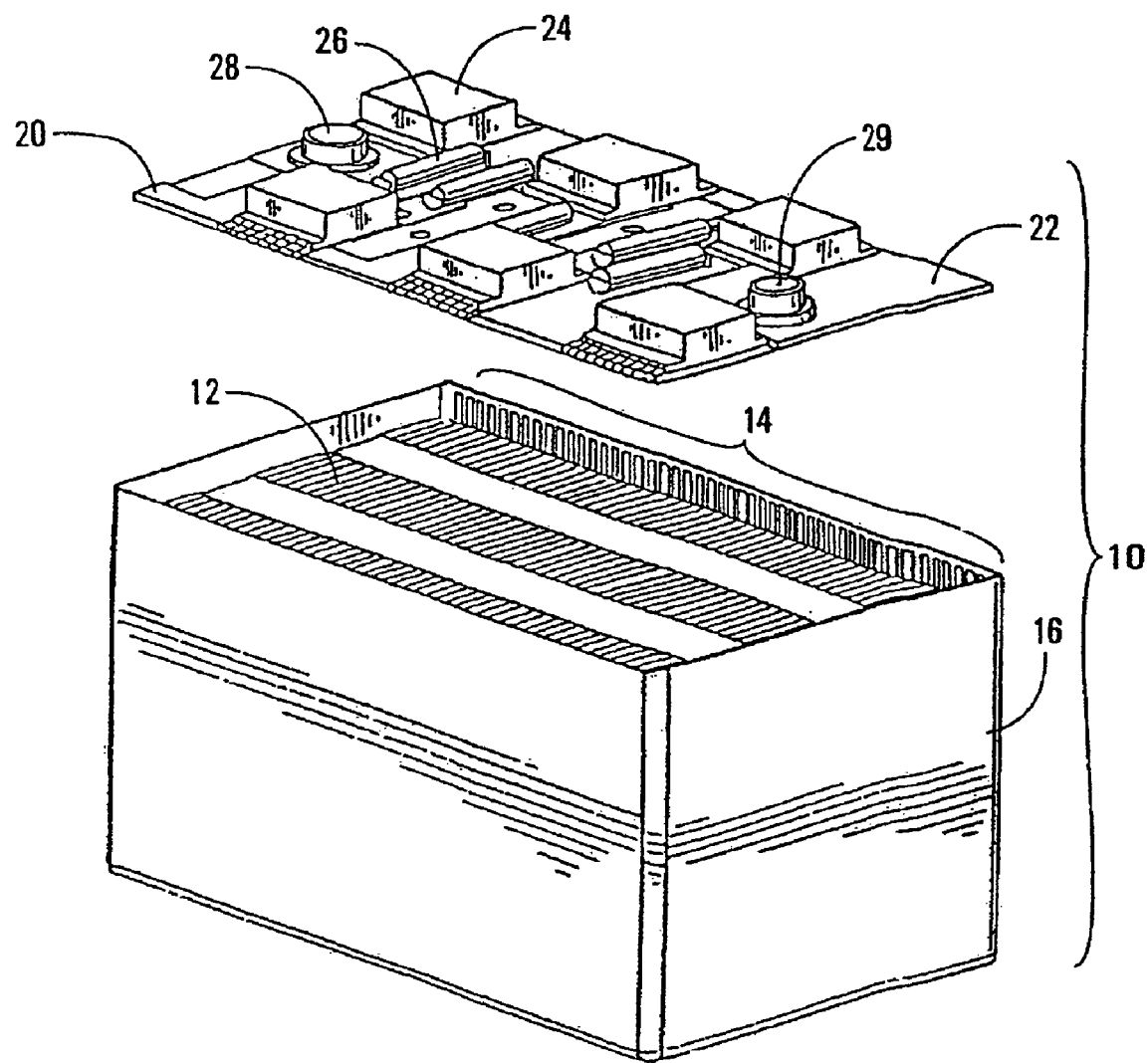
FIG. 1 is a partial perspective view illustrating an energy storage module according to an example of implementation of the invention.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION

Referring now to the drawings, and more particularly to FIG. 1, there is provided a partial illustration of an example of implementation of an energy storage module or battery 10 which utilizes a number of rechargeable solid-state thin-film electrochemical cells 12 for storing electrical energy. Such rechargeable thin-film electrochemical cells are particularly well-suited for use in the construction of high-current, high-voltage energy storage modules and batteries, such as those used to power electric vehicles or as back-up electricity supply for telecommunication networks for example.

As shown in FIG. 1, the energy storage module 10 includes a number of individual electrochemical cells 12 which are arranged in a stack configuration 14 and situated in a housing 16. It will be appreciated that a generic stack 14 of electrochemical cells 12 may be interconnected in various parallel and series relationships to achieve desired current and voltage ratings. To facilitate selective series or parallel connectivity within the stack 14 of electrochemical cells 10, an interconnect board 20 is situated within the housing 16.

The interconnect board 20 includes a connection pattern which, when the board 20 is installed within the housing 16, interconnects the electrochemical cells 12 in accordance with a pre-established connection configuration. The board 20 may be connected to a bus bar itself connected to each individual cell 12 or directly connected to the electrochemical cells 12 through a connection pattern typically affixed or otherwise bonded to a sheet of insulating material 22, such as a substantially rigid plastic or laminate material. A number of electrical and electro-mechanical components may also be mounted on the interconnect board 20.

As shown in the example of FIG. 1, the interconnect board 20 includes a number of fuse packs 24, equalizer and bypass devices 26, and positive and negative power terminals 28 and 29. It is understood that any or all of the components populating the interconnect board 20 may be mounted on boards or platforms other than the interconnect board 20, and situated internal to or externally of the module housing 16. In one embodiment, the interconnect board 20 shown in FIG. 1 and the electrochemical cells 12 are disposed in a hermetically sealed housing 16.

Figure 2:
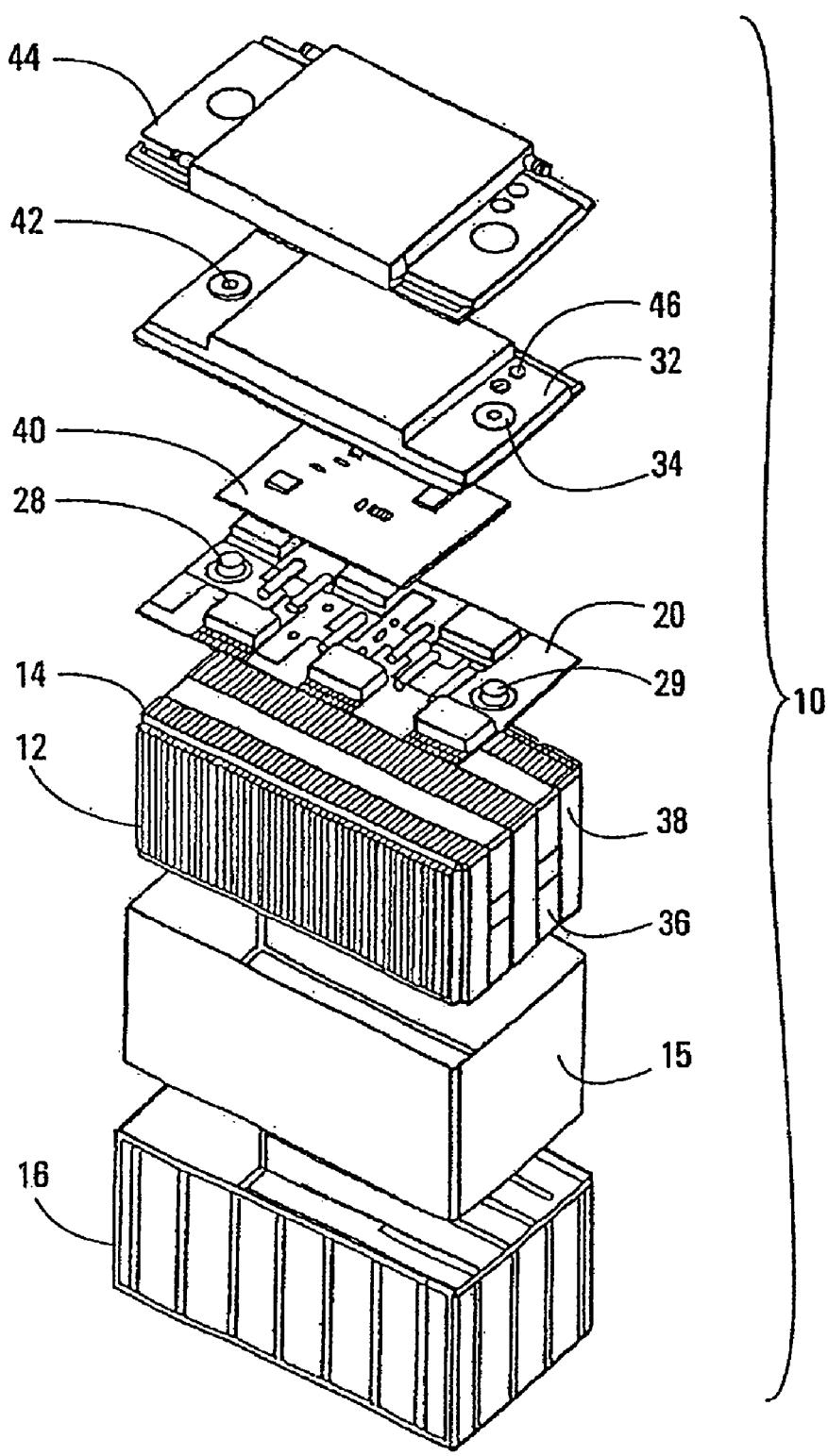
FIG. 2 is an exploded perspective view illustrating an energy storage module according to an example of implementation of the invention.

In FIG. 2, there is illustrated an exploded view of one example of a complete energy storage module 10 that includes an inner shell 15 which contains a stack 14 of electrochemical cells 12 and various electronic boards, including an interconnect board 20 as previously discussed.

An inner shell cover 32 incorporates a hermetic seal 34, that seals various feed-through provided in the inner shell cover 32.

In accordance with the particular example of implementation shown in FIG. 2, the module 10 includes a stack 14 of electrochemical cells 12 which are interconnected through use of the interconnect board 20. The stack 14 of electrochemical cells 12 are subjected to a continuous compressive force generated by use of the bands 36, end plates 38 and a foam or spring-type element disposed within or adjacent each of the cells 12.

The interconnect board 20 is situated above the cell stack 14 and includes control circuitry for all electrochemical cells 12 constituting the cell stack 14. The control circuitry includes a short circuit protection device such as a fuse pack, a bypass device, and an equalizer circuit, which control the operation of the cell pack 14 while charging and discharging, as well as an electronic self-diagnosis system. Accordingly, each of the cells 12 is monitored and controlled by a control circuit. A control board 40, situated above the interconnect board 20, includes a processor that monitors and controls each cell 12. As such, the control board 40 provides for module level monitoring and control during charging and discharging and floating.

A pair of quick connectors 42 pass through corresponding holes provided in an inner shell cover 32 and serve as the main power terminals of the module 10. The quick connectors 42 are hermetically sealed to the inner shell cover 32 using a sealing apparatus 34. When an outer shell cover 44 is positioned onto the inner shell cover 32, the quick connectors 42 are received into mating sockets 28 and 29 mounted on the interconnect board 20. Communication connectors 46, which pass through the inner shell cover 32 and are similarly hermetically sealed thereto, provide external access to the control board 40 and other electronic boards of the module 10.

A hermetic seal is provided between the inner shell 15 and inner shell cover 32 by welding the inner shell cover 32 to the top of the inner shell 15. The hermetically sealed inner shell 15 is then inserted into an outer shell 16. The outer shell 16 may be fabricated from glass filled polypropylene through use of an injection molding process, and may be characterized by a thickness of approximately 2 mm.

Figure 3:
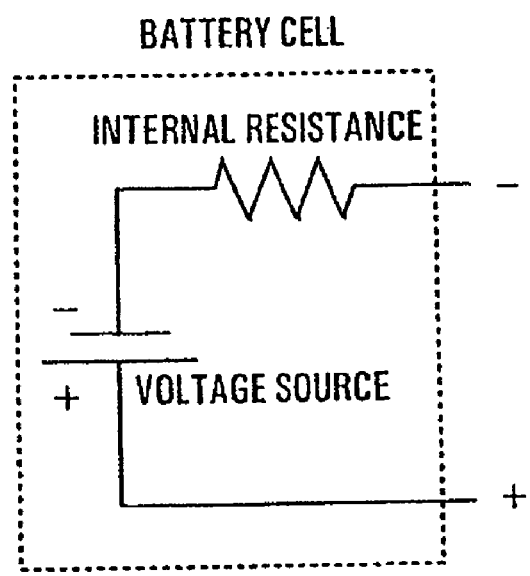
FIG. 3 is a schematic representation of a voltage source with an internal resistance.
Figure 4:
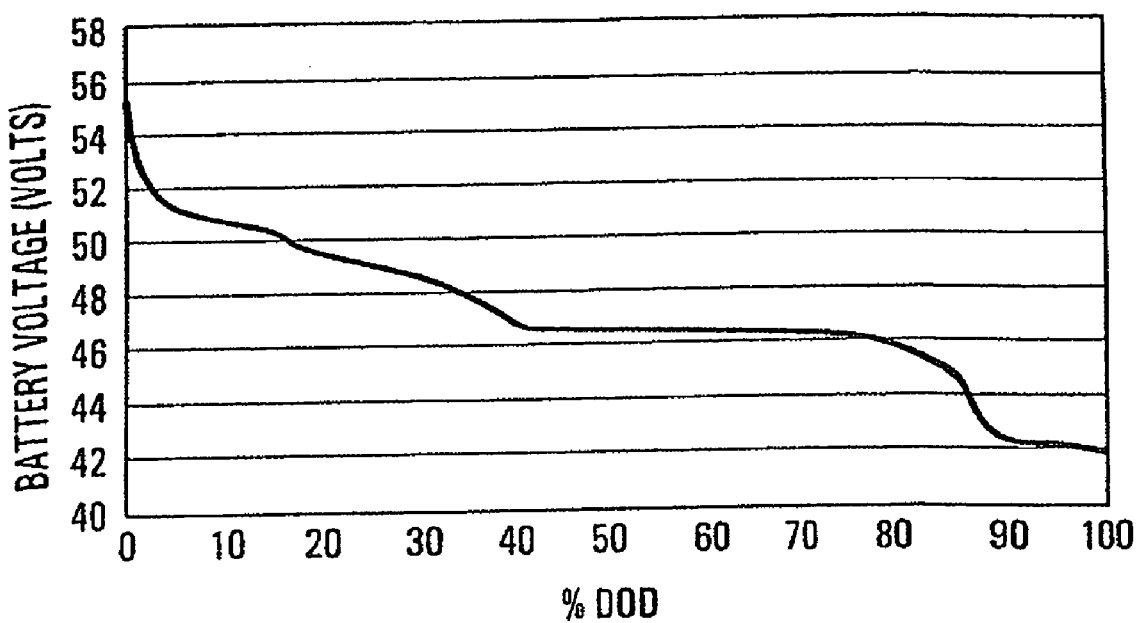
FIG. 4 is a typical discharge curve of a Lithium-metal-polymer battery.

A battery or a electrochemical cell can be approximated as a voltage source with an internal resistance as illustrated in FIG. 3. The voltage source is characterized by its discharge curve. This curve mainly depends on the electrolyte type used in the battery. FIG. 4 illustrates a typical discharge curve for a Lithium-metal-polymer battery. The discharge curve of a particular battery is affected by the temperature of the battery and the load current. An increase in load current will produce a temporary drop of the discharge curve, thereby reducing the battery capacity to hold its charge, whereas an increase in temperature will raise the discharge curve. The discharge curve is also affected by the internal resistance of the battery or of the electrochemical cells making up the battery. As the battery ages during floating, charging and discharging, its internal resistance increases causing the discharge curve to drop which effectively reduces the battery capacity. The State of Health of a battery is defined as a fraction or percentage of the initial battery capacity when the battery was new for a complete discharge under given conditions (rate of discharge).

A battery end of life is arbitrarily set at a point when the battery reaches a battery capacity expressed in Ampere-Hour (Ah) of about 80% of its initial (100%) capacity, under a specific rate of discharge at a specific temperature. Once the battery no longer meets the set requirement of battery capacity, the battery should be replaced and/or disposed of. Depending on applications, the battery end of life threshold may be set at a higher or a lower percentage of its initial capacity.

Figure 5:
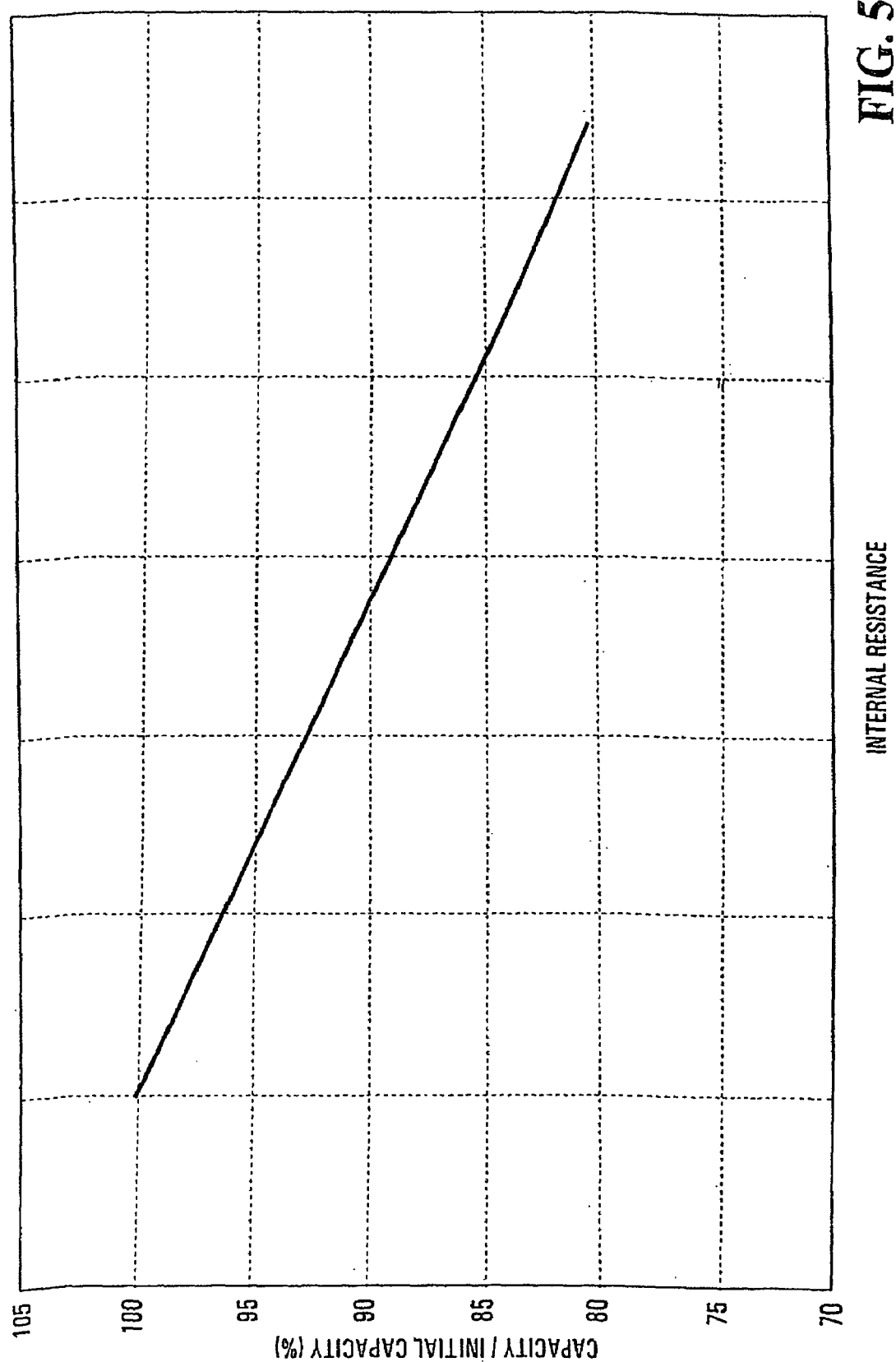
FIG. 5 is a graphical representation of the evolution of a battery capacity as a function of its internal resistance.

Experiments have shown that the overall internal resistance of a battery is defined by the internal resistance of each electrochemical cell making up the battery, and may be correlated directly to the capacity fade of the battery or battery state of health. As shown in FIG. 5, the capacity of the battery decreases with the increase of overall internal resistance of the battery in a predictable manner. The relation between the two parameters is almost linear and may be expressed as an equation of the type: Y=mX+b. In this example of implementation of the present invention, this data has been tabulated such that the measured internal resistance of the battery may be correlated to a percentage value included in this table. This correlation enables the self-diagnosis system of the battery to determine the battery state of health and to extrapolate the battery end of life, and this is accomplished no matter what the state of charge of the battery is. By measuring, for each individual electrochemical cell, an initial voltage and a second voltage for a given current, at a predetermined cell temperature, the self-diagnosis system of the battery calculates the overall internal resistance of the battery to determine exactly the state of health of the battery (updated full charge battery capacity).

In one example, the self-diagnosis system sets a specific precise current, measures a voltage difference according to Ohm's law $$R = \frac{\Delta V}{\Delta I}$$

(the relation between the voltage and the current) and calculates the exact internal resistance of each cell constituting the battery. Since the initial current value is zero, the equation is simplified to $$R = \frac{\Delta V}{I}.$$

The use of a precise set current value eliminates the inaccuracy of current measurements and enables an accurate calculation of the internal resistance. The theoretical fixed current value is however measured to validate the real current value and allow for fine tuning of the fixed current for repeatability purposes. The self-diagnosis system measures the internal resistance of each cell one at a time and stores the results in memory. The state of health of the battery is defined as the weakest link in the cell string; therefore the highest internal resistance is retained to determine the exact percentage of battery capacity remaining in the battery or its state of health.

From the value of the state of health of the battery correlated to the internal resistance of the weakest cell, the self-diagnosis system retrieves an initial capacity based on a corresponding discharge curve of the battery, which takes into account the internal resistance of the battery. With the selected initial capacity of the battery according to its actual state of health, the self-diagnosis system is able to provide an accurate indication of the state of charge of the battery at all time by calculating the current drawn from the battery over time as the energy or capacity is drawn from the battery, which represents the area under the discharge curve. Similarly, when the battery is being charged, the self-diagnosis system calculates the energy or capacity returned into the battery by monitoring the charge current over time. The state of charge indicates the level of charge of the battery, which enables to precisely evaluate the remaining back-up time the battery can provide under a measured rate of discharge until the battery is fully discharged.

There are several ways to evaluate the internal resistance. The self-diagnosis system may use any one of the following methods with similar accuracy, among other possible evaluation methods. Each method measures voltages and calculates the internal resistance of each individual electrochemical cell making up the battery, one cell at a time.

Figure 6:
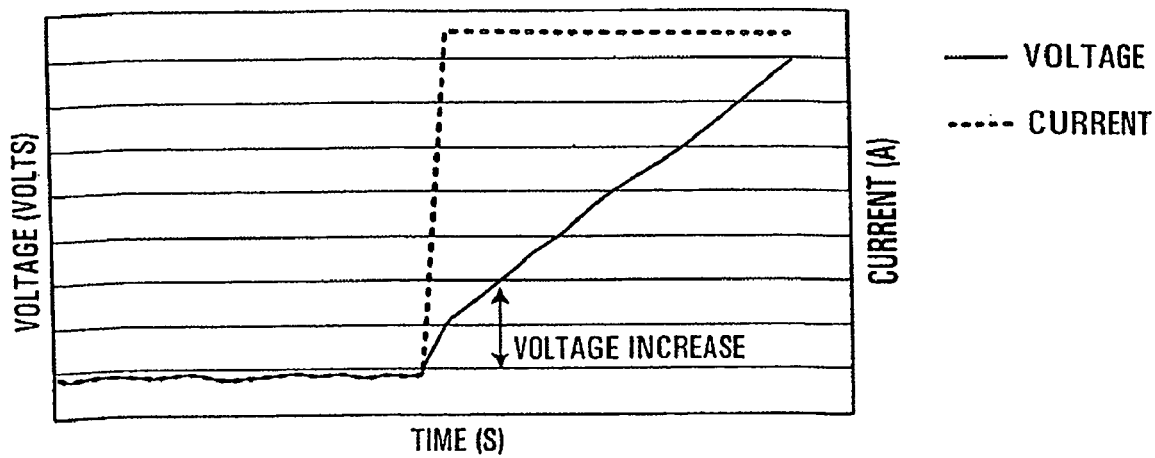
FIG. 6 is a graph of voltage variations relative to current variation according to a first method of calculation of the internal resistance of individual cells.

The first method of calculation is to measure internal resistance of each electrochemical cell during a small charge at constant current as represented by FIG. 6. As shown in FIG. 6, a constant current is applied to the electrochemical cell and the voltage increases. The diagnosis system measures an initial voltage Vi prior to the application of the current and measures a second voltage Vf after the application of the current. The instantaneous increase in voltage divided by the current indicates the internal resistance of the individual cell. This measurement is stored in memory and repeated for each cell of the battery. The overall internal resistance of the battery is calculated by a processor and correlated to a state of health value, itself correlated to a battery initial capacity representative of the battery state of health.

Figure 7:
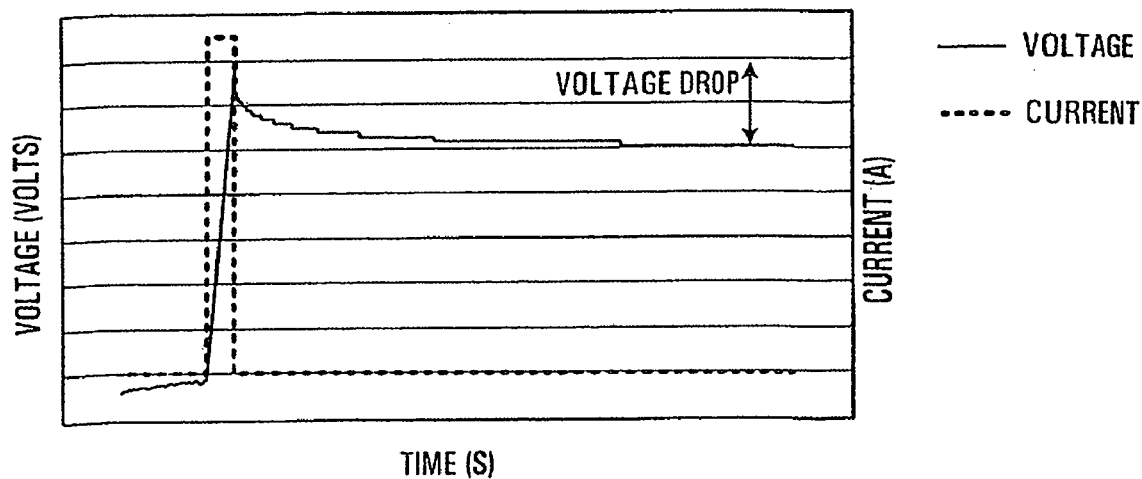
FIG. 7 is a graph of voltage variations relative to current variations according to a second method of calculation of the internal resistance of individual cells.

The second method of calculation is to measure internal resistance on each cell after a small charge starting at a initial voltage. As shown in FIG. 7, after a charge at constant current, the voltage relaxation creates a drop of the cell voltage. This drop is measured at a specific time and divided by the current to calculate the internal resistance of the cell. This measurement is stored in memory and repeated for each cell of the battery. The overall internal resistance of the battery is calculated by a processor and correlated to a state of health value, itself correlated to a battery initial capacity representative of the battery state of health.

Figure 8:
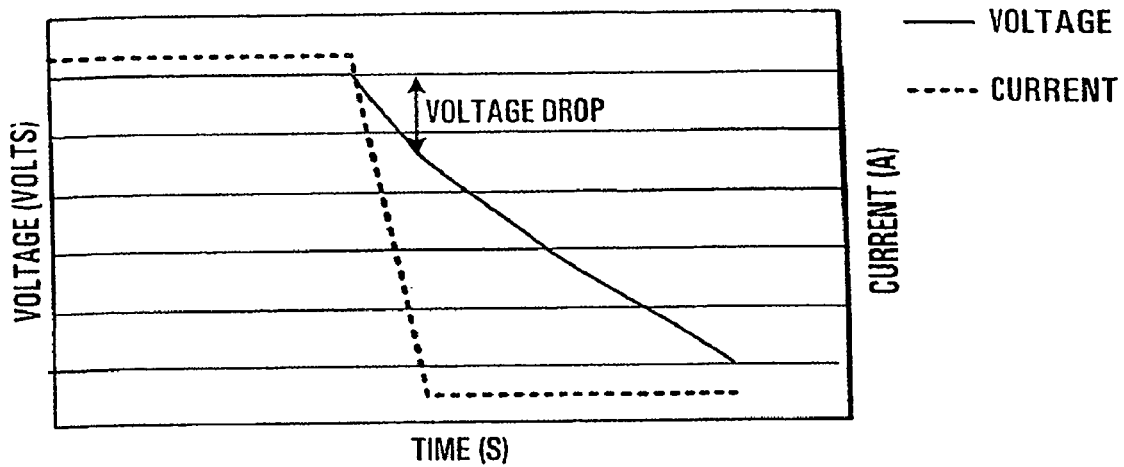
FIG. 8 is a graph of voltage variations relative to current variations according to a third method of calculation of the internal resistance of individual cells.

The third method of calculation is to measure internal resistance of each cell during a small discharge at constant current starting at an initial voltage. As shown in FIG. 8, the instantaneous decrease in voltage divided by the current indicates the internal resistance of the cell. This measurement is stored in memory and repeated for each cell of the battery. The overall internal resistance of the battery is calculated by a processor and correlated to a state of health value, itself correlated to a battery initial capacity representative of the battery state of health.

Figure 9:
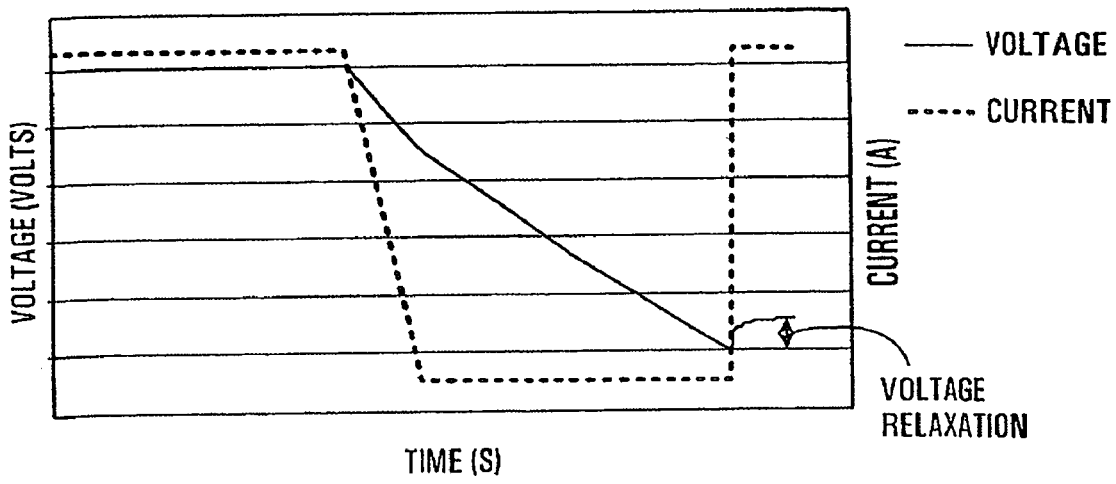
FIG. 9 is a graph of voltage variations relative to current variations according to a fourth method of calculation of the internal resistance of individual cells.

The fourth method of calculation is to measure internal resistance on each cell after a small discharge at constant current starting at an initial voltage. As shown in FIG. 9, after a discharge at constant current, the voltage relaxation creates a bump of the voltage. This bump is measured at a specific time and divided by the current to evaluate the internal resistance of the cell. This measurement is stored in memory and repeated for each cell of the battery. The overall internal resistance of the battery is calculated by a processor and correlated to a state of health value, itself correlated to a battery initial capacity representative of the battery state of health.

Although small, these repetitive discharges are routed into the application network connected to the battery or batteries to avoid wasting any energy while performing diagnosis routine. This feature of the testing procedure enables the system to monitor the state of health of the battery at any time with minimal energy wastage.

Any one of these methods of calculation may be implemented through the self-diagnosis system to obtain an accurate value of the internal resistance of the battery, which can be correlated to the actual battery capacity or state of health.

Figure 10:
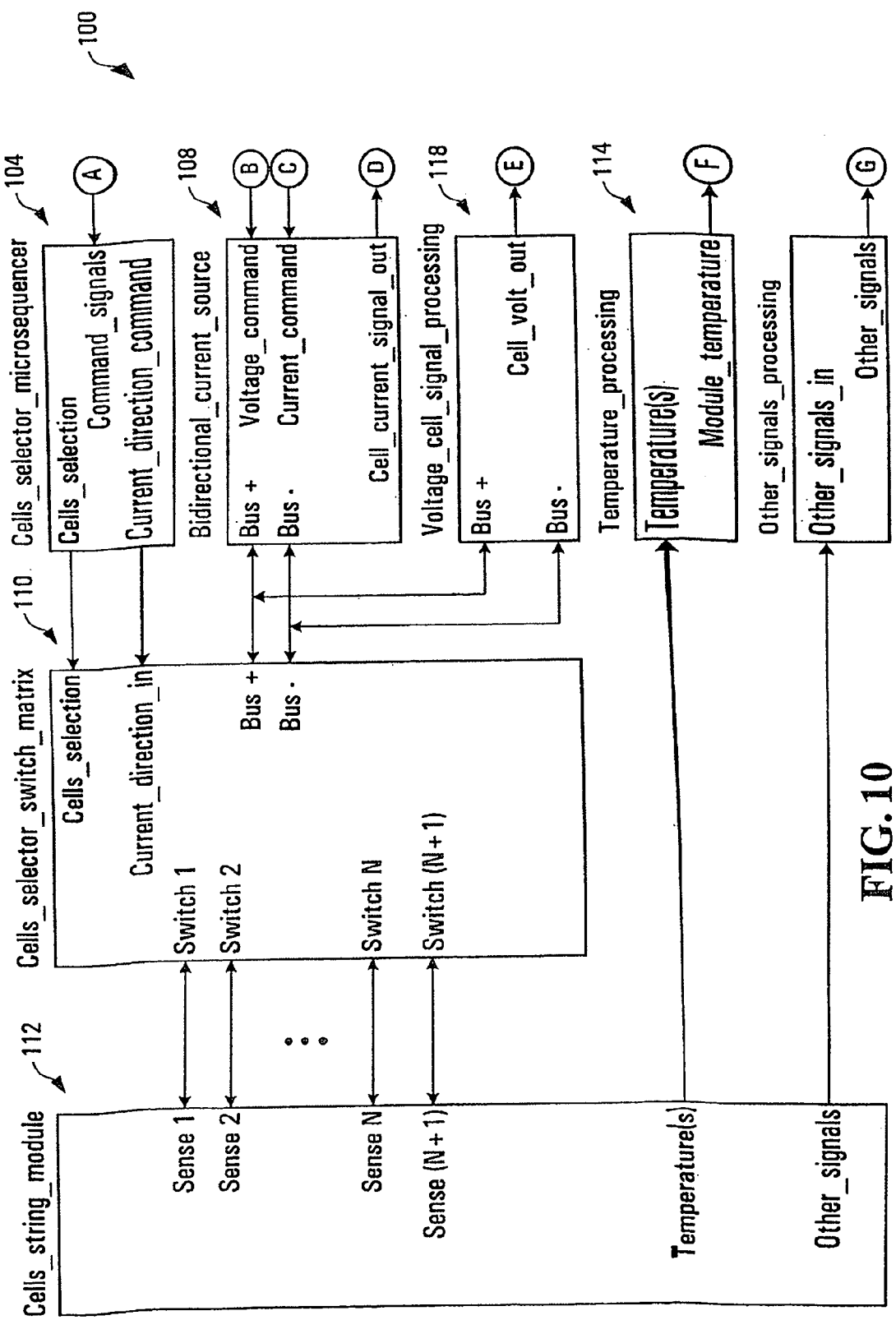
FIG. 10 is a schematic diagram of a diagnosis system according to an example of implementation of the invention.
Figure 10:
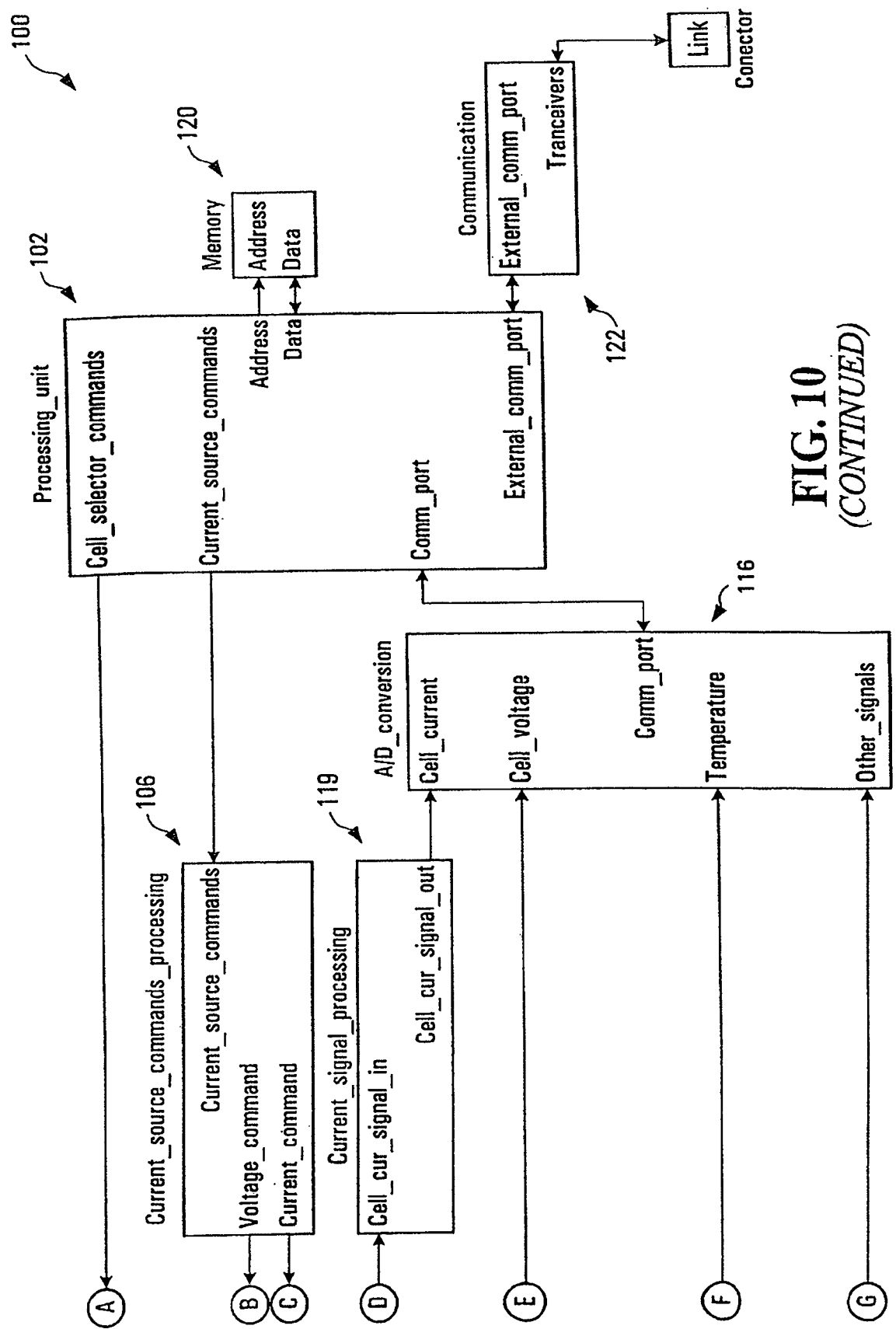

FIG. 10 is a diagram of a self-diagnosis system 100 of an energy storage device, according to an example of implementation of the present invention. The self-diagnosis system 100 comprises a main processing unit 102, a cell selector sequencer 104, a current source commands processor 106, a bi-directional current source 108, a voltage cell signal processor 118, current signal processor 119, and a cell selector switch 110 coupled to each cell of the electrochemical cells string 112 of the battery. The cells string module 112 comprises at least one temperature sensor connected to a temperature processing unit 114. Self-diagnosis system 100 further comprises an A/D signal conversion unit 116 adapted to transform analog signals received from various sources into readable digital signals for processing unit 102.

Processing unit 102 comprises a memory 120 for storing its own executing program, the various curves and capacity data in table form and data received from individual cells, and a external communication port 122 for sending or receiving data to an external station through internet or telephone links. Processing unit 102 commands the diagnosis routine for evaluating the state of health of the battery which may be scheduled at regular intervals or when a specific situation occurs such as full discharge, or may be ordered by a remote user.

When the routine begins, processing unit 102 first selects the test to be performed on each individual cell from one of the four tests outlined above and sends a corresponding signal to cell selector microsequencer 104. Microsequencer 104 sets the current direction according to the test sequence (charge or discharge) and feeds the corresponding signals to cell selector switch 110. According to the test being performed, the processing unit 102 sends a signal to current source commands processor 106 to either feed or retrieve a specific constant current to or from the cell selected by cell selector switch 110 through bi-directional current source 108, which relays the current to or from the selected cell. Whatever the test being performed, the current is fixed and a first and second voltage are measured. The fixed current value and the voltage measurements taken at the selected cell are relayed to A/D signal conversion unit 116 through voltage cell signal processor 118 and current signal processor 119. The average temperature of the cells is measured at regular intervals by at least one temperature sensor connected to a temperature processing unit 114, which relays the temperature signals to A/D signal conversion unit 116. The voltage, current and temperature signals are converted from analog to digital signals and sent to processing unit 102, which in turn calculates precisely the internal resistance of the selected cell and stores the internal resistance value into memory. The test is repeated for each individual cell of the battery following the routine established by processing unit 102 and cell selector switch 110.

Once the internal resistance values for all of the cells have been calculated and stored into memory 120, the processing unit 102 correlates the highest measured internal resistance value of the electrochemical cells of the cell string with the data from the graph shown in FIG. 5. This data, whether in table form or as an equation of the type $Y=mX+b$, represents the internal resistance vs. capacity of the battery, and is also stored in memory 120. From that correlation, processing unit 102 extrapolates an overall state of health of the battery or energy storage device. With the outlined cell by cell evaluation of the internal resistance, diagnosis system 100 is able to provide specific data on the overall state of health of the battery and raise alarm flags if one particular cell shows an abnormally high internal resistance and is found defective. Based on the graph of FIG. 5, processing unit 102 is able to provide an accurate evaluation of the battery remaining life in numbers of cycles; this value can be extrapolated in months or years based on the history of battery use i.e. number of cycles over time.

With an established battery state of health, processing unit 102 retrieves from memory 120 the battery initial capacity corresponding to the updated battery state of health.

With this specific initial capacity, the diagnosis system 100 is able to keep tabs on the exact level of charge of the battery and evaluates the remaining back-up time the battery can provide under various conditions. When the battery is solicited and is under discharge, the discharge current is monitored over time and the energy or capacity extracted from the battery, calculated as $I\delta t$ (current x time), which represents the area under the discharge curve, is subtracted such that the diagnosis system 100 knows at all time the remaining capacity of the battery and can evaluate the remaining time the battery can provide a given current.

Note that, in a variant, the final steps of determining the exact level of charge of the battery and evaluating the remaining back-up time based on the state of health of the individual cells may be carried out by an external system (not shown) or by a remote user linked to self-diagnosis system 100, which retrieves the internal resistance values of each cell through external communication port 122. The external system or remote user similarly retrieves a battery initial capacity corresponding to the updated battery state of health and determines the exact level of charge of the battery and evaluates the remaining back-up time the battery can provide under given conditions.

If the battery is under load, the self-diagnosis system 100, the external diagnosis system or the remote user will calculate the amount of remaining back-up time under a measured instantaneous rate of discharge until the battery is discharged. This information is stored into memory for reference and for trend analysis.

Although the present invention has been described in relation to particular variations thereof, other variation and modifications are contemplated and are within the scope of the present invention. Therefore the present invention is not to be limited by the above description but is defined by the appended claims.

We claim:

1. A self-diagnosis system for an energy storage device, the energy storage device comprising a plurality of electrochemical cells, said self-diagnosis system comprising:
   a cell selector for selecting individual ones of the electrochemical cells; and
   a processing unit coupled to said cell selector, said processing unit being operative for:
      deriving information regarding a respective internal resistance of each one of the electrochemical cells selected by said cell selector; and
      deriving an indication of a state of health of the energy storage device based at least in part on the information regarding the respective internal resistance of each one of the electrochemical cells selected by said cell selector.

2. A self-diagnosis system as claimed in claim 1, wherein said processing unit is operative for:

for each particular one of the electrochemical cells selected by said cell selector:
   receiving information regarding at least one voltage of that particular one of the electrochemical cells;
   obtaining information regarding a current flowing in that particular one of the electrochemical cells; and
   deriving the information regarding the respective internal resistance of that particular one of the electrochemical cells based at least in part on
      (i) the information regarding the at least one voltage of that particular one of the electrochemical cells and
      (ii) the information regarding the current flowing in that particular one of the electrochemical cells.

3. A self-diagnosis system as claimed in claim 2, further comprising:
   voltage measurement means coupled to said processing unit, said voltage measurement means being operative for providing to said processing unit the information regarding the at least one voltage of each particular one of the electrochemical cells selected by said cell selector.

4. A self-diagnosis system as claimed in claim 3, wherein the information regarding the at least one voltage of each particular one of the electrochemical cells selected by said cell selector includes information regarding an initial voltage of that particular one of the electrochemical cells and information regarding a subsequent voltage of that particular one of the electrochemical cells.

5. A self-diagnosis system as claimed in claim 4, further comprising:
   a current source coupled to said processing unit, said current source being operative for causing a current having a specific value to flow in each particular one of the electrochemical cells selected by said cell selector;
   wherein the information regarding the current flowing in each particular one of the electrochemical cells selected by said cell selector is indicative of the specific value of the current flowing in that particular one of the electrochemical cells.

6. A self-diagnosis system as claimed in claim 5, wherein the specific value of the current flowing in each particular one of the electrochemical cells selected by said cell selector is substantially constant.

7. A self-diagnosis system as claimed in claim 1, wherein said processing unit is operative for:
   determining a highest internal resistance value based at least in part on the information regarding the respective internal resistance of each one of the electrochemical cells selected by said cell selector; and
   deriving the indication of the state of health of the energy storage device based at least in part on the highest internal resistance value.

8. A self-diagnosis system as claimed in claim 7, wherein said processing unit comprises a memory for storing data representative of state of health as a function of internal resistance, and wherein said processing unit is operative for:
   correlating the highest internal resistance value to the data representative of state of health as a function of internal resistance so as to derive the indication of the state of health of the energy storage device.

9. A self-diagnosis system as claimed in claim 5, wherein the current caused by said current source to flow in each particular one of the electrochemical cells selected by said cell selector causes a charge of that particular one of the electrochemical cells.

10. A self-diagnosis system as claimed in claim 5, wherein the current caused by said current source to flow in each particular one of the electrochemical cells selected by said cell selector causes a discharge of that particular one of the electrochemical cells.

11. A self-diagnosis system as claimed in claim 1, wherein said processing unit is further operative for:
deriving information regarding a state of charge of the energy storage device based at least in part on the indication of the state of health of the energy storage device.

12. A self-diagnosis system as claimed in claim 11, wherein said processing unit is further operative for:
deriving information regarding energy flowing in or out of the energy storage device by monitoring current flow in the energy storage device over time; and
updating the information regarding the state of charge of the energy storage device based at least in part on the information regarding energy flowing in or out of the energy storage device.

13. A self-diagnosis system as claimed in claim 12, wherein said processing unit is further operative for:
deriving information indicative of a period of time for which the energy storage device is capable of providing a given current, based at least in part on the updated information regarding the state of charge of the energy storage device.

14. A self-diagnosis system as claimed in claim 1, further comprising a communication port communicatively coupled to said processing unit, said processing unit being operative for:
releasing the indication of the state of health of the energy storage device to an entity external to the energy storage device via said communication port.

15. A self-diagnosis system as claimed in claim 11, further comprising a communication port communicatively coupled to said processing unit, said processing unit being operative for:
releasing the information regarding the state of charge of the energy storage device to an entity external to the energy storage device via said communication port.

16. A self-diagnosis system as claimed in claim 13, further comprising a communication port communicatively coupled to said processing unit, said processing unit being operative for:
releasing the information indicative of a period of time for which the energy storage device is capable of providing a given current to an entity external to the energy storage device via said communication port.

17. A self-diagnosis system as claimed in claim 1, wherein said processing unit is further operative for:
deriving information indicative of a period of time for which the energy storage device is capable of providing a given current, based at least in part on the indication of the state of health of the energy storage device.

18. A self-diagnosis system as claimed in claim 10, wherein the energy storage device is adapted to be connected to a load, and wherein the respective discharge of each particular one of the electrochemical cells selected by said cell selector is applied to the load.

19. An energy storage device comprising:
a plurality of electrochemical cells; and
a self-diagnosis system comprising:
a cell selector for selecting individual ones of said electrochemical cells; and
a processing unit coupled to said cell selector, said processing unit being operative for:
deriving information regarding a respective internal resistance of each one of said electrochemical cells selected by said cell selector; and
deriving an indication of a state of health of said energy storage device based at least in part on the information regarding the respective internal resistance of each one of said electrochemical cells selected by said cell selector.

20. A method for self-diagnosis of an energy storage device, the energy storage device comprising a plurality of electrochemical cells, said method comprising:
selecting individual ones of the electrochemical cells;
deriving information regarding a respective internal resistance of each selected one of the electrochemical cells; and
deriving an indication of a state of health of the energy storage device based at least in part on the information regarding the respective internal resistance of each selected one of the electrochemical cells.

* * * * *